(12) United States Patent
Isomura

(10) Patent No.: US 6,521,883 B2
(45) Date of Patent: Feb. 18, 2003

(54) PHOTOVOLTAIC DEVICE

(75) Inventor: Masao Isomura, Kyoto-fu (JP)

(73) Assignee: Sanyo Electric Co., Ltd., Osaka (JP)

( * ) Notice: Subject to any disclaimer, the term of this patent is extended or adjusted under 35 U.S.C. 154(b) by 69 days.

(21) Appl. No.: 09/901,629

(22) Filed: Jul. 11, 2001

(65) Prior Publication Data
US 2002/0008192 A1 Jan. 24, 2002

(30) Foreign Application Priority Data

Jul. 18, 2000 (JP) ......................................... 2000-217371
Jul. 18, 2000 (JP) ......................................... 2000-217372

(51) Int. Cl.$^7$ ............................................. H01L 31/00
(52) U.S. Cl. ..................... 250/214.1; 257/441; 257/458
(58) Field of Search .......................... 250/206, 214 R, 250/214, 1; 327/509, 514, 573; 340/870.28, 870.29; 257/370.01, 371, 431, 53, 55, 458, 464, 65, 2, 22, 80, 84; 136/249, 258, 261, 255

(56) References Cited

U.S. PATENT DOCUMENTS 5,324,364 A * 6/1994 Matsuda et al. ............ 136/249

* cited by examiner

Primary Examiner—David Porta
Assistant Examiner—Patrick J. Lee
(74) Attorney, Agent, or Firm—Arent Fox Kintner Plotkin & Kahn, PLLC

(57) ABSTRACT

This invention provides a photovoltaic device including an n-type microcrystalline Si layer, an i-type microcrystalline SiGe layer, and a p-type microcrystalline Si layer laminated on a substrate and using a thin microcrystalline silicon based semiconductor layer as a photoactive layer. The i-type microcrystalline SiGe layer is a microcrystalline SiGe layer which a Ge composition ratio is 20–40 at. %, a signal intensity of a Ge—Ge bond is 30–60% of a signal intensity of a Si—Si bond observed by the Raman spectroscopy, and a signal intensity of a Si—Ge bond is between those of the above two signal intensities.

5 Claims, 5 Drawing Sheets light

8: comb-shaped electrode
7: transparent conductive layer
6: p-type microcrystalline Si
5: microcrystalline SiGe
4: n-type microcrystalline Si
3: transparent conductive layer
2: high reflective metal
1: supporting substrate

PHOTOVOLTAIC DEVICE

BACKGROUND OF THE INVENTION

1. Field of the Invention

This invention relates to a photovoltaic element using microcrystalline silicon germanium (μc-SiGe) as a photoactive layer.

2. Description of Prior Art

A photovoltaic device mainly containing amorphous silicon (referred as a-Si herein after) formed by photo CVD and glow discharge decomposition of material gas is featured by that it can be a thin film and is easy to expand its dimension, and has been expected to be manufactured at low cost.

A pin-type a-Si photovoltaic device having pin junction is a general photovoltaic device. FIG. 9 illustrates a structure of such the photovoltaic device. The device is formed by laminating a transparent electrode 22, a p-type a-Si layer 23, an intrinsic (i) type a-Si layer 24, an n-type a-Si layer 25, and a metal electrode 26 on a glass substrate 21 in this order. When light is incident through the glass substrate 21, the photovoltaic device generates photovoltaic power.

Regarding the a-Si photovoltaic device, it is known that light degradation occurs after light is irradiated. To solve this problem, a photovoltaic device using microcrystalline silicon, material which is thin and has high stability to light irradiation, as a photoactive layer has been proposed. The microcrystalline silicon is a thin film having mixture of a microcrystalline silicon (Si) phase and an amorphous silicon (a-Si) phase.

As described above, the microcrystalline silicon (Si) has been paid attention as a technique for overcoming the problem of light degradation in the amorphous silicon (a-Si) based semiconductor layer. However, a light absorption coefficient of the microcrystalline silicon is less as compared with the amorphous silicon, and a thickness of 2 μm or more is required for using as a photoactive layer. Therefore, a very high forming speed is required when considering productivity of solar cells. With the present state, however, such forming speed can not be achieved while maintaining good characteristics.

To solve the problem, this invention uses microcrystalline silicon germanium (SiGe) having a greater light absorption coefficient than the microcrystalline silicon and makes a thinner photoactive layer. To overcome the problem, the following factor must be satisfied.

In order to make the photoactive layer 1 μm or less in thickness, a light absorption coefficient of the microcrystalline silicon germanium must be at least three times as great as of the microcrystalline silicon. To achieve such the light absorption coefficient, a composition ratio of germanium (Ge) in the microcrystalline silicon germanium (SiGe) should be 20 at. % or more.

SUMMARY OF THE INVENTION

This invention is made to provide a photovoltaic device using a microcrystalline silicon based semiconductor thin layer having a small thickness as a photoactive layer.

A photovoltaic device of this invention comprises a supporting substrate, a first electrode formed on the supporting substrate, a semiconductor layer including a photoactive layer and formed on the first electrode, and a second electrode formed on the semiconductor layer. The photoactive layer is a microcrystalline silicon germanium layer which a Ge composition ratio is 20–40 at. %, a signal intensity of a germanium-to-germanium bond is 30–60% of a signal intensity of a silicon-to-silicon bond observed by the Raman spectroscopy, and a signal intensity of a silicon-to-germanium bond is between the above two signal intensities, and a thickness of the photoactive layer is 1 μm or less.

The microcrystalline silicon germanium layer is satisfied that the signal intensity of the germanium-to-germanium bond is 35–55% of the signal intensity of the silicon-to-silicon bond observed by the Raman spectroscopy.

The Ge composition ratio of the microcrystalline silicon germanium layer is 20–40%.

A photovoltaic device of this invention comprises a supporting substrate, a first electrode formed on the supporting substrate, a semiconductor layer including a photoactive layer and formed on the first electrode, a second electrode formed on the semiconductor layer. The photoactive layer is a microcrystalline silicon germanium layer which a Ge composition ratio is 20–40 at. %, a crystal size is 5–300 Å, and a thickness of the photoactive layer is 1 μm or less.

The crystal size of the microcrystalline silicon germanium layer is 10–200 Å.

The photovoltaic device with the above structure using the thin microcrystalline silicon germanium as the photoactive layer can provide good conversion efficiency.

The foregoing and other objects, features, aspects and advantages of the present invention will become more apparent from the following detailed description of the present invention when reviewed in conjunction with the accompanying drawings.

DESCRIPTION OF THE PREFERRED EMBODIMENT(S)

Figure 1:
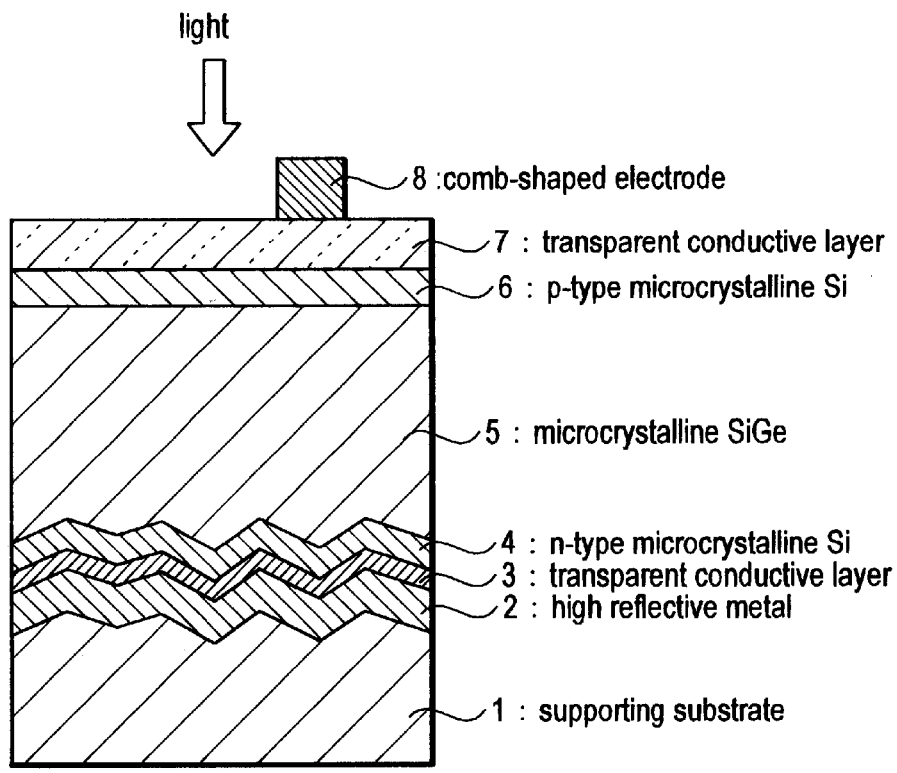
FIG. 1 is a cross sectional view illustrating a photovoltaic device according to the embodiment of the invention, using microcrystalline silicon germanium (SiGe) as a photoactive layer.

Explanation of the embodiments of the invention is made by referring to the drawings. FIG. 1 is a cross sectional view illustrating the photovoltaic device of the embodiment according to this invention, using the microcrystalline silicon germanium (SiGe) as a photoactive layer.

The photovoltaic device shown in FIG. 1, includes a high reflective metal layer 2 of silver (Ag) or the like formed on a supporting substrate 1 of glass, metal or the like. The substrate 1 has a minutely irregular surface formed by etching to obtain a light confinement effect. This irregular shape can be formed on a surface of the high reflective metal layer 2. On the high reflective metal layer 2, a transparent conductive layer 3 of ZnO of 500 Å in thickness is formed. The transparent conductive layer 3 prevents alloy reaction between an n-type microcrystalline silicon (Si) layer 4 to be formed next and the high reflective metal layer 2.

An n-type microcrystalline Si layer 4 of 300 Å in thickness, an i-type microcrystalline SiGe layer 5 of 5000 Å in thickness that is the feature of this invention, and a p-type microcrystalline Si layer 6 of 300 Å in thickness are laminated in this order on the transparent conductive layer 3. On the p-type microcrystalline Si layer 6, a surface transparent conductive layer 7 of ZnO of 500 Å in thickness is formed, and a comb-shaped electrode 8 of silver or the like is formed on the transparent conductive layer 7. Light is incident from the transparent conductive layer 7.

The ZnO layer is formed by sputtering, and the n-type microcrystalline Si layer 4 and the p-type microcrystalline Si layer 6 are formed by parallel-plate RF plasma CVD at 13.56 MHz. Other layers except for the microcrystalline SiGe layer 5 can be formed by any methods as long as effects of the invention can be obtained. In addition, the transparent conductive layers 3, 7 can be an $SnO_2$ layer or ITO other than the ZnO layer.

The photovoltaic element using the microcrystalline silicon as a photoactive layer is generally required to be not less than 2 μm in thickness. However, when considering an amount of material to be used, throughput, and stability of the element, the thickness of the photoactive layer is suitably 0.1–1.0 μm. The i-type microcrystalline SiGe layer 5 according to this invention is formed by following steps.

The microcrystalline SiGe layer 5 is formed by parallel-plate RF plasma CVD at 13.56 MHz with input power 200 mW/cm$^2$, pressure 39.9 Pa, and a substrate temperature 250° C. A delusion ratio of hydrogen ($H_2/SiH_4+GeH_4$) is 30%, and a germane flow ratio ($GeH_4/SiH_4+GeH_4$) is 10%. Power frequency of plasma CVD is not particularly specified and any of high frequency and direct current can be used.

The Ge composition ratio of the microcrystalline SiGe layer 5 formed under the above conditions is 30 at. % and a forming rate is approximately 2 Å per second. The microcrystalline SiGe layer 5 comprises silicon (Si), germanium (Ge), and silicon germanium (SiGe) crystalline particles of 20–300 Å in size and an amorphous part. A ratio of the amorphous part to the crystalline particles is less than 10%. Light absorption coefficients for 800 nm, 900 nm, and 1000 nm are respectively 5000 cm$^{-1}$ or more, 1500 cm$^{-1}$ or more, 800 cm$^{-1}$ or more, and are approximately four times as great as those of the microcrystalline silicon. Therefore the thickness of the layer 5 is made 5000 Å, a fourth of that of the microcrystalline silicon.

Figure 2:
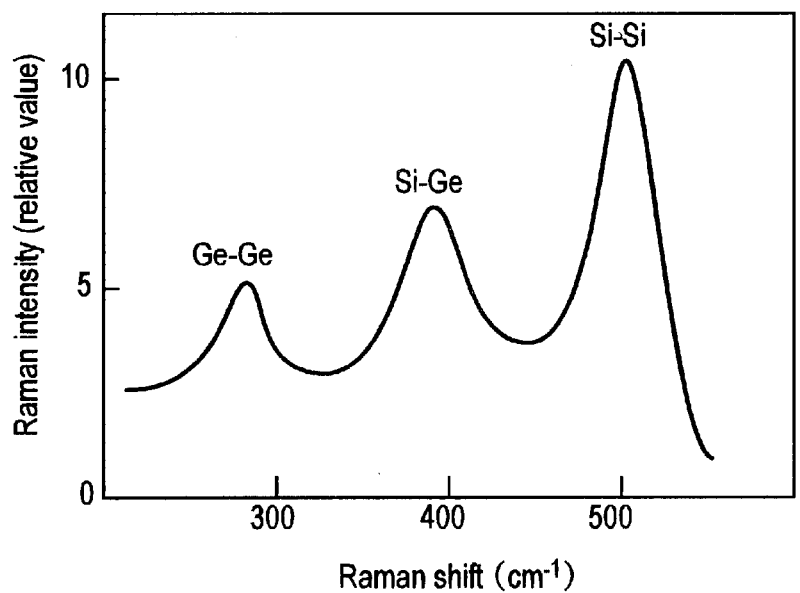
FIG. 2 is a Raman spectrum diagram when measuring a microcrystalline SiGe layer of a Ge composition ratio 30 at. % in the embodiment of this invention.

FIG. 2 is a Raman spectrum diagram when measuring the microcrystalline SiGe layer of the Ge composition ratio 30 at. % by the Raman spectroscopy. When a single color light of vibration vo is irradiated to a substance and the light is dispersed, Raman lines of a stokes line vo-vmn and an anti stokes line vo+vmn appear by the Raman effect. The Raman spectroscopy measures a wavelength and dispersion intensity of the Raman line for the purposes of identification and quantification of a substance.

FIG. 2 shows a signal of a silicon-to-silicon (Si—Si) bond at the peak around 500 cm$^{-1}$, a signal of a silicon-to-germanium (Si—Ge) bond at the peak around 400 cm$^{-1}$, and a signal of a germanium-to-germanium (Ge—Ge) at the peak around 280 cm$^{-1}$ in the microcrystalline SiGe layer of the Ge composition ratio 30 at. % formed by the above method. The signal of the silicon-to-germanium (Si—Ge) bond reduces its peak height to 70% of the signal of the Si—Si bond, and the signal of the germanium-to-germanium bond reduces its peak height to 50% of the signal from the Si—Si bond. The signal of the silicon-to-germanium bond is between those of the Si—Si bond and the Ge—Ge bond.

Conversion efficiency of a photovoltaic device using the microcrystalline silicon germanium layer as a photoactive layer is 8% under light irradiation AM-1.5, 100 mW/cm$^2$. This value is equivalent to one of a photovoltaic element formed under the same conditions except that the photoactive layer is formed of microcrystalline silicon of 2 μm in thickness. Thus the same characteristics can be obtained by the photoactive layer of a fourth thickness.

Figure 3:
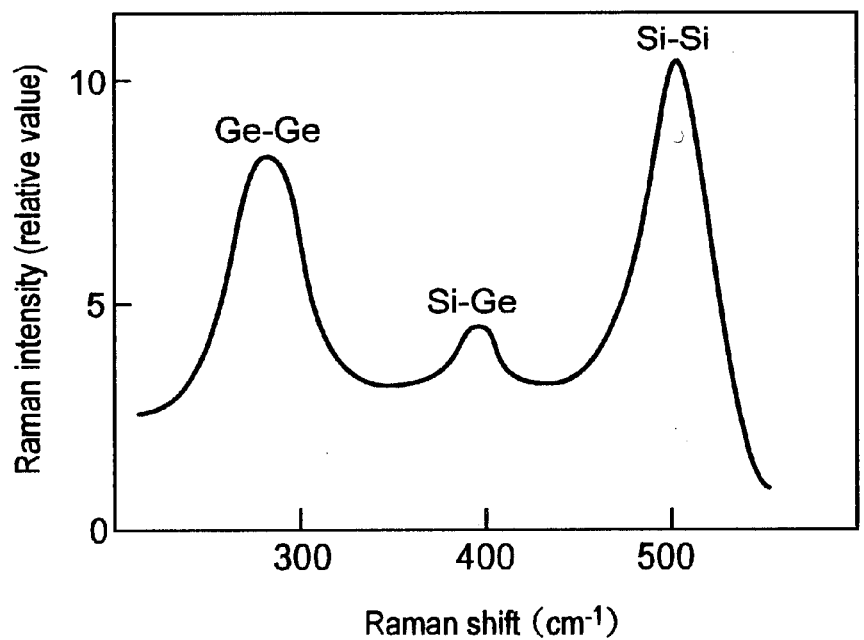
FIG. 3 is a Raman spectrum diagram when measuring a microcrystalline SiGe layer of a Ge composition ratio 30 at. % for comparison.

Then, a microcrystalline silicon germanium (SiGe) layer having the Ge composition ratio 30 at. % and having a signal intensity different from the one of the embodiment, when measured by the Raman spectroscopy, is formed for comparison. FIG. 3 is a Raman spectrum when measuring the microcrystalline SiGe layer having the Ge composition ratio 30 at. % formed for comparison by the Raman spectroscopy. The microcrystalline silicon germanium layer is formed under the same conditions as above except that the input power is 1000 mW/cm$^2$, and the pressure is 399 Pa.

When the layer is formed under these conditions, deviation in composition caused by polymerization in a vapor phase and insufficient surface reacting time may occur. Therefore, the signal of Si—Ge reduces its peak height to 45% of that of Si—Si and 70% of that of Ge—Ge respectively.

Conversion efficiency of the photovoltaic device using the microcrystalline silicon germanium (SiGe) layer as a photoactive layer is 3% under light irradiation of AM-1.5, 100 mW/cm$^2$.

Then, the microcrystalline SiGe which the signal intensity from the Ge—Ge bond is changed with respect to the signal intensity of the Si—Si bond by varying input power and pressure, is formed, and a photovoltaic device using the layer as the photoactive layer is prepared. Changes in conversion efficiency of the photovoltaic device measured under light irradiation of AM-1.5, 100 mW/cm$^2$ are shown in FIG. 4.

Figure 4:
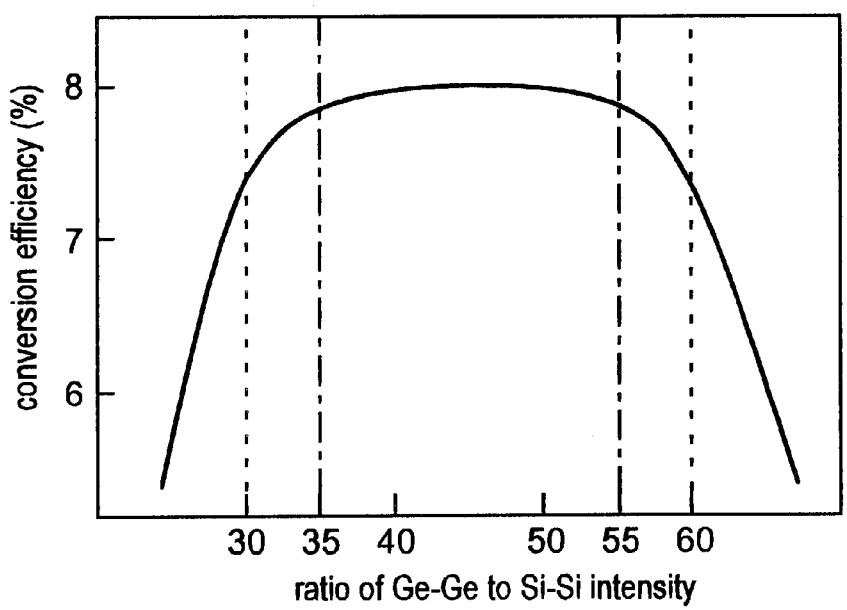
FIG. 4 is a characteristic diagram when measuring conversion efficiency of the photovoltaic device using microcrystalline SiGe which a signal intensity of a Ge—Ge bond is changed with respect to a signal intensity of a Si—Si bond is used as the photoactive layer.

As shown in FIG. 4, when the signal intensity at a peak height of the Ge—Ge bond is less than 30% or over 60% of the signal intensity of the Si—Si bond observed by the Raman spectroscopy, the conversion efficiency is greatly reduced. On the other hand, when the signal intensity at a peak height of the Ge—Ge bond is 30–60% of the signal intensity of the Si—Si bond observed by the Raman spectroscopy, the conversion efficiency is changed only slightly. When considering efficiency in mass production, great changes in conversion efficiency caused by composition changes is undesirable. When the signal intensity at a peak height of the Ge—Ge bond. is 30–60% of the signal intensity of the Si—Si bond observed by the Raman spectroscopy, the conversion efficiency is changed only slightly, and good characteristics can be obtained. Particularly, when the signal intensity at a peak height of the Ge—Ge bond is 35–55% of the signal intensity of the Si—Si bond observed by the Raman spectroscopy, better characteristics can be obtained.

Figure 5:
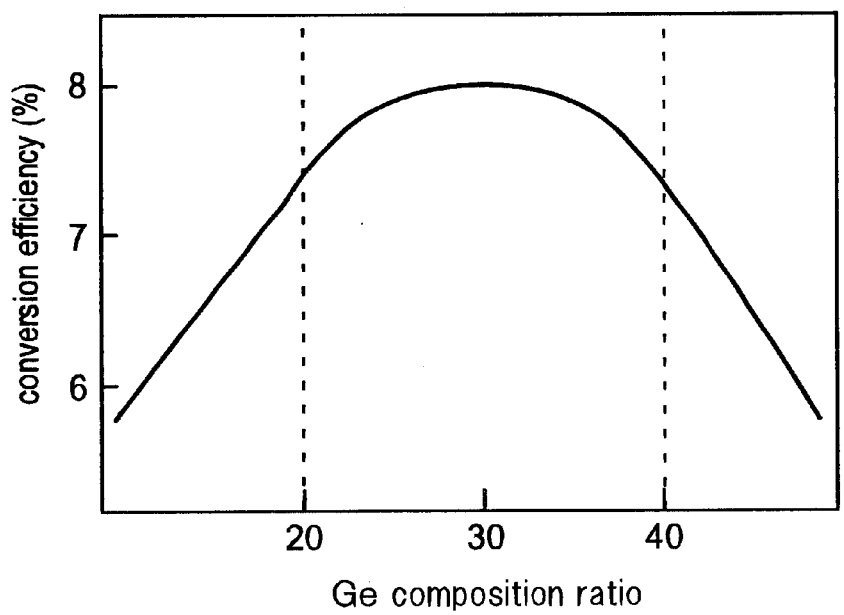
FIG. 5 is a characteristic diagram when measuring conversion efficiency of the photovoltaic device using microcrystalline SiGe of the varied Ge composition ratio as the photoactive layer.

Then, a microcrystalline SiGe layer is formed by parallel plate RF plasma CVD at 13.56 MHz, where input power is 200 mW/cm$^2$, pressure is 39.9 Pa, and a substrate temperature is 250° C., and further a hydrogen delusion ratio (H$_2$/SiH$_4$+GeH$_4$) is 30%, and a flow ratio of germanium is changed from 5–50% to change the Ge composition ratio. The signal intensity at a peak height of the Ge—Ge bond of the microcrystalline SiGe layers formed under these conditions is 30–60% of the signal intensity of the Si—Si bond observed by the Raman spectroscopy. And the photovoltaic device using the microcrystalline silicon germanium layer as the photoactive layer is prepared. Changes in conversion efficiency of the photovoltaic devices are measured under light irradiation of AM-1.5, 100 mW/cm$^2$. The results are shown in FIG. 5. It is found that when the Ge composition ratio is 20–40 at. %, good characteristics can be obtained.

Furthermore, a microcrystalline SiGe layer is formed by parallel plate RF plasma CVD at 13.56 MHz, where input power is 200 mW/cm$^2$, pressure is 39.9 Pa, and a substrate temperature is 250° C., and a hydrogen delusion ratio (H$_2$/SiH$_4$+GeH$_4$) and a germane flow ratio (GeH$_4$/SiH$_4$+GeH$_4$) are varied. Under the above conditions, a particle size of the microcrystalline SiGe layer depends on the hydrogen delusion ratio (H$_2$/SiH$_4$+GeH$_4$), and as the hydrogen delusion ratio is higher, the particle size increases. Furthermore, when the germane flow ratio (GeH$_4$/SiH$_4$+GeH$_4$) is varied, the Ge composition ratio in the layer changes. When the germane flow ratio (GeH$_4$/SiH$_4$+GeH$_4$) is 10%, the Ge composition ratio in the microcrystalline SiGe layer 5 is 30 at. %. A power frequency of plasma CVD is not particularly specified, and can be high frequency and direct current.

Figure 6:
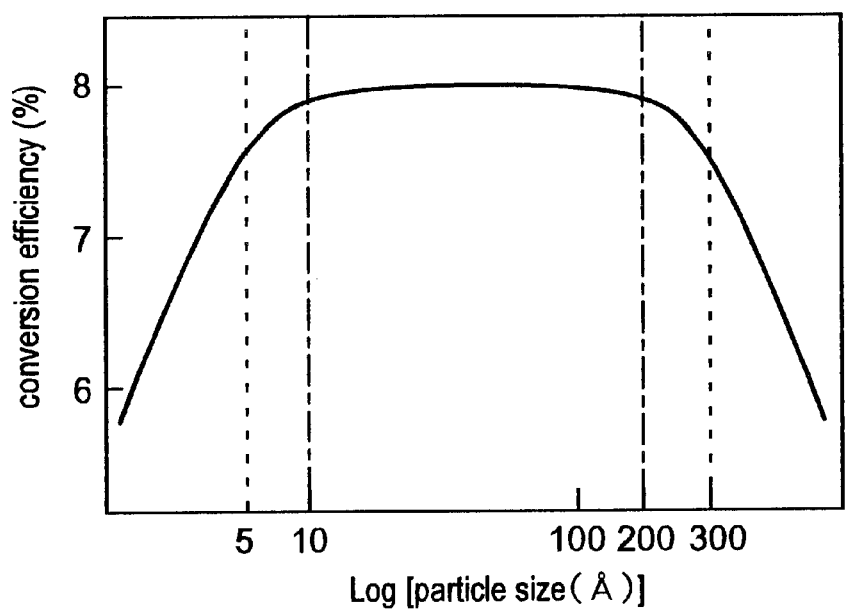
FIG. 6 is a characteristic diagram when measuring conversion efficiency of the photovoltaic device using microcrystalline SiGe of the Ge composition ratio 30 at. % having a variety of particle sizes as the photoactive layer.

When the microcrystalline SiGe layer 5 is produced under the condition of the germane flow ratio (GeH$_4$/SiH$_4$+GeH$_4$) 10%, the Ge composition ratio is 30 at. %. Furthermore, when the hydrogen delusion ratio (H$_2$/SiH$_4$+GeH$_4$) is varied from 10–100%, the particle size is changed. The microcrystalline SiGe layer 5 of the Ge composition ratio 30 at. % with a particle size varied depending on various hydrogen delusion ratios (H$_2$/SiH$_4$+GeH$_4$) from 10 to 100 is produced. The thickness of the microcrystalline SiGe layer 5 is 5000 Å, a fourth of that of the microcrystalline silicon layer. Conversion efficiency of the photovoltaic device using the layer as the photoactive layer is measured under light irradiation of AM-1.5, 100 mW/cm$^2$. The results are shown in FIG. 6.

A particle size is obtained from the following Scherrer expression in accordance with the x-ray diffraction spectrum.

Particle (crystal) size=(0.9×x-ray wavelength)/(half-width of diffraction signal cos (diffraction angle))     Expression 1

Conditions for measuring x-ray diffraction in this embodiment are that an x-ray source is Cu (Kα) (40.0 kV, 40.0 m), a wavelength is 1.54060 Å.

As shown in FIG. 6, when the particle size is 5 Å or smaller and 300 Å or greater, the conversion efficiency is greatly reduced even by a minute change. On the other hand, when the particle size is 5–300 Å, the conversion efficiency does not change greatly even when the signal intensity is changed. When considering efficiency in mass production, it is undesirable that conversion efficiency is changed greatly by a change in composition. When the particle size is 5–300 Å, the conversion efficiency does not change greatly even by the change in composition and good characteristics are obtained. Particularly, when the particle size is 10–200 Å, more better characteristics are obtained.

In conjunction with this, in material such as silicon having a particle size 10 μm or greater, generally referred as polycrystalline material, recombination of carriers, and disturbance of carrier flow by an electrical barrier generated in a grain boundary caused by defects in the grain boundary may occur, and thus material of a large particle size with less grain boundaries is preferred. However, in microcrystalline material of a relatively small particle size as in this invention, a distance between grain boundaries is short, and a carrier is always affected by the grain boundaries. The microcrystalline material is regular and is different from the irregular polycrystalline material. Therefore, when the conditions in this invention are satisfied, a carrier can transport without disturbed by an electrical barrier in spite of the presence of many grain boundaries.

The microcrystalline SiGe of this invention is different from polycrystalline silicon of a large particle size, and the characteristics are improved when the particle size is 5–300 Å. Because the particle size is small, effects not presented by crystalline material, that is quantum optics characteristics, other than the conventional material characteristics can be obtained. Thus, this microcrystalline SiGe can be regarded as new material rather than polycrystalline material of a small particle size.

Figure 7:
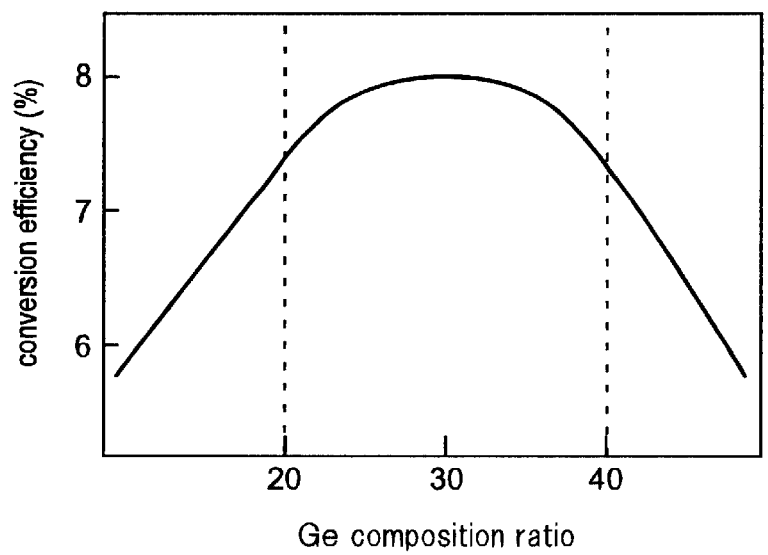
FIG. 7 is a characteristic diagram when measuring conversion efficiency of the photovoltaic device using the microcrystalline SiGe of varied Ge composition ratios as the photoactive layer.

Then, a microcrystalline SiGe layer is formed by parallel plate RF plasma CVD at 13.56 MHz, where input power is 200 mW/cm$^2$, pressure is 39.9 Pa, and a substrate temperature is 250° C., and a hydrogen delusion ratio (H$_2$/SiH$_4$+GeH$_4$) is controlled so that the particle size becomes 150 Å, and a germane flow ratio (GeH$_4$/SiH$_4$+GeH$_4$) are varied from 5 to 50% so as to change the Ge composition ratio. A photovoltaic device using this microcrystalline silicon germanium layer as a photoactive layer is prepared. Conversion efficiency of the photovoltaic device is measured under light irradiation of AM-1.5, 100 mW/cm$^2$. The results are shown in FIG. 7. When the Ge composition ratio is 20–40 at. %, good results are obtained.

Figure 8:
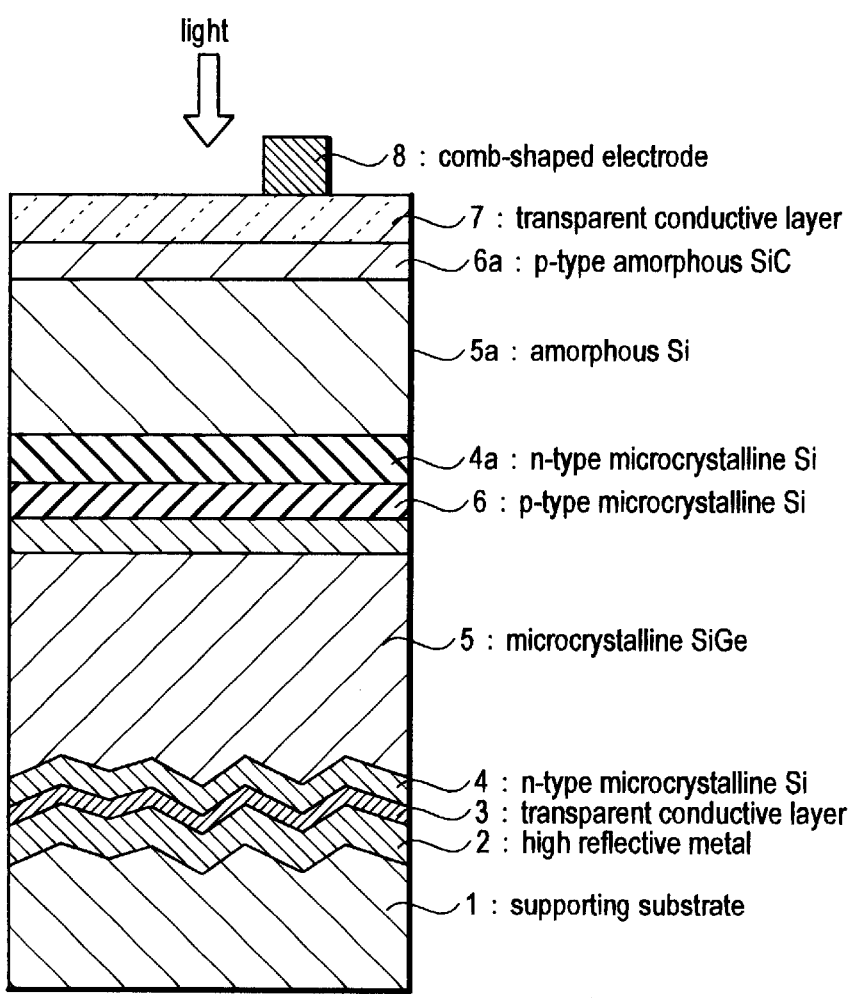
FIG. 8 is a cross sectional view illustrating a photovoltaic element of the second embodiment of this invention.
Figure 9:
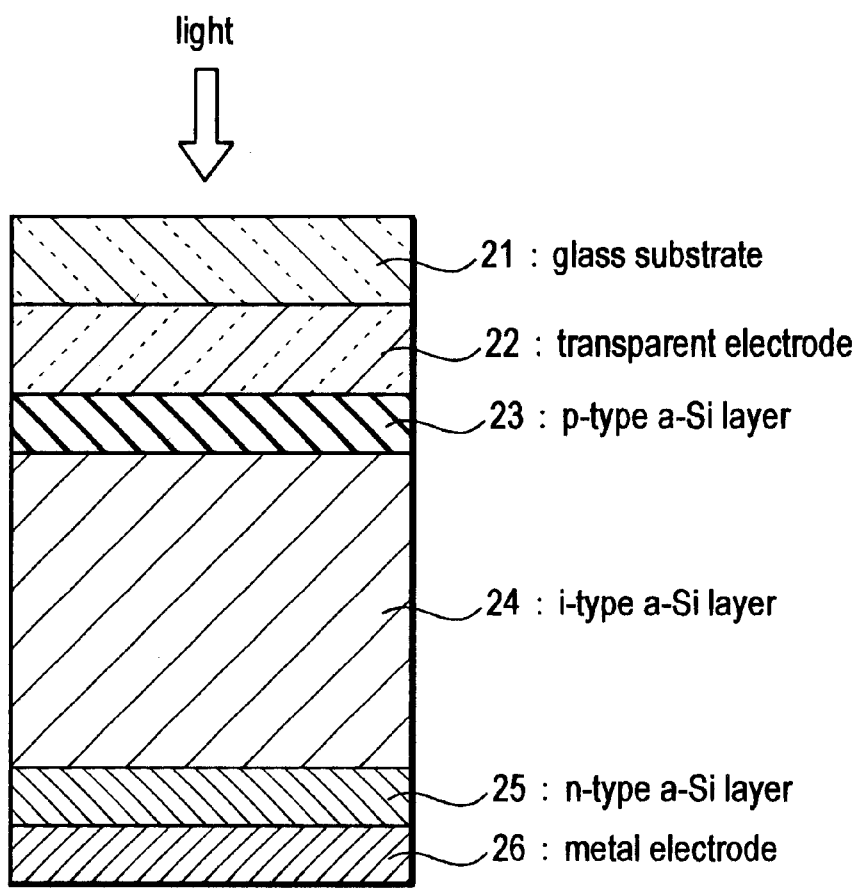
FIG. 9 is a cross sectional view of a conventional photovoltaic element.

A second embodiment of the invention is illustrated in FIG. 8. FIG. 8 is a cross sectional view illustrating a photovoltaic device according to the second embodiment of this invention. The same elements have the same reference numbers and explanation on them is omitted. The photovoltaic device of this embodiment includes a structure which a plurality of semiconductor layers of an nip structure are laminated. A high reflective metal layer 2, a transparent conductive layer 3, an n-type microcrystalline Si layer 4 (4a), an i-type semiconductor layer 5 (5a), and a p-type semiconductor layer 6 (6a) are laminated in this order on a supporting substrate 1.

FIG. 8 illustrates a photovoltaic element having the n-type microcrystalline Si layer 4a, the i-type amorphous Si layer 5a, and the p-type amorphous SiC layer 6a laminated on a light incident side of the photovoltaic element shown in FIG. 1. The p-type amorphous SiC layer 6a and the i-type amorphous Si layer 5a are formed by the parallel plate RF plasma CVD of 13.56 MHz. Other elements are the same as in the first embodiment.

In the second embodiment, a short circuit current is 12 mA/cm$^2$, an open circuit voltage is 1.30 V, a fill factor is 0.71, and conversion efficiency is 11% under the same measurement conditions as in the first embodiment. These values are equivalent to the values of the photovoltaic element formed by the same conditions except that the element includes the microcrystalline Si layer instead of the microcrystalline SiGe active layer, and advantages of this invention are proved.

This invention is applicable to a lamination type photovoltaic device having more than three layers of an nip semiconductor structure other than the single layer structure formed on the substrate as shown in the first embodiment and the two layer structure as shown in the second embodiment. Furthermore, this invention is applicable to a photovoltaic device which light is incident from a direction opposite to the above embodiments, or the light is incident from a substrate side.

Although the present invention has been described and illustrated in detail, it should be clearly understood that the description discloses examples of different embodiments of the invention and is not intended to be limited to the examples or illustrations provided. Any changes or modifications within the spirit and scope of the present invention are intended to be included, the invention being limited only by the terms of the appended claims.

What is claimed is:

1. A photovoltaic device comprising a supporting substrate, a first electrode formed on the supporting substrate, a semiconductor layer including a photoactive layer and formed on the first electrode, and a second electrode formed on the semiconductor layer, wherein the photoactive layer is a microcrystalline silicon germanium layer which a Ge composition ratio is 20–40 at. %, a signal intensity of a germanium-to-germanium bond is 30–60% of a signal intensity of a silicon-to-silicon bond observed by the Raman spectroscopy, a signal intensity of a silicon-to-germanium bond is between the above two signal intensities, and a thickness of the photoactive layer is 1 $\mu$m or less.

2. The photovoltaic device according to claim 1, wherein the microcrystalline silicon germanium layer is satisfied that the signal intensity of the germanium-to-germanium bond is 36–55% of the signal intensity of the silicon-to-silicon bond observed by the Raman spectroscopy.

3. The photovoltaic device according to claim 1, wherein the Ge composition ratio of the microcrystalline silicon germanium layer is 20–40%.

4. A photovoltaic device comprising a supporting substrate, a first electrode formed on the supporting substrate, a semiconductor layer including a photoactive layer and formed on the first electrode, a second electrode formed on the semiconductor layer, wherein the photoactive layer is a microcrystalline silicon germanium layer which a Ge composition ratio is 20–40 at. %, a crystal size is 5–300 Å, and a thickness of the photoactive layer is 1 $\mu$m or less.

5. The photovoltaic device according to claim 4, wherein the crystal size of the microcrystalline silicon germanium layer is 10–200 Å.

* * * * *